(12) United States Patent
Oppelt

(10) Patent No.: US 9,154,106 B2
(45) Date of Patent: Oct. 6, 2015

(54) BROADBAND BALUN

(75) Inventor: Ralph Oppelt, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 583 days.

(21) Appl. No.: 13/538,805

(22) Filed: Jun. 29, 2012

(65) Prior Publication Data

US 2013/0169375 A1     Jul. 4, 2013

(30) Foreign Application Priority Data

Jul. 1, 2011   (DE) .......................... 10 2011 078 549

(51) Int. Cl.
| | |
|---|---|
| *H03H 7/42* | (2006.01) |
| *G01R 33/36* | (2006.01) |
| *H03H 5/00* | (2006.01) |
| *H03H 1/00* | (2006.01) |

(52) U.S. Cl.
CPC ............. *H03H 7/42* (2013.01); *G01R 33/3685* (2013.01); *H03H 2001/005* (2013.01)

(58) Field of Classification Search
CPC ............. H03H 5/00; H03H 7/42; H01F 27/28
USPC ...................... 333/25, 26; 336/170
See application file for complete search history.

(56) References Cited

U.S. PATENT DOCUMENTS

| | | | | |
|---|---|---|---|---|
| 3,428,886 | A | * | 2/1969 | Yushi et al. ..................... 333/33 |
| 5,767,754 | A | | 6/1998 | Menna |
| 6,033,593 | A | * | 3/2000 | Onizuka et al. ............ 252/62.62 |
| 6,130,588 | A | * | 10/2000 | Gallivan et al. ................. 333/25 |
| 7,671,595 | B2 | * | 3/2010 | Griswold et al. ............. 324/322 |
| 8,294,464 | B2 | * | 10/2012 | Gudino et al. ................ 324/318 |

FOREIGN PATENT DOCUMENTS

DE     698 14 484 T2     4/2004

OTHER PUBLICATIONS

M. Ehrenfried, The design of Ruthroff broadband voltage transformers, www.Sputter.com/G8jnj, V3.0, Jul. 27, 2008, 18 pages.*
German Office Action dated Apr. 2, 2012 for corresponding German Patent Application No. DE 10 2011 078 549.3 with English translation.

* cited by examiner

*Primary Examiner* — Dean Takaoka
(74) *Attorney, Agent, or Firm* — Lempia Summerfield Katz LLC

(57) ABSTRACT

For broadband applications of a balun in a magnetic field, the balun includes at least three line transformers each having two transformer sides. At least two transformer sides of the balun that belong to different line transformers of the at least three line transformers are embodied for the same voltage drop at least in terms of magnitude. The at least two transformer sides of the balun are also embodied with an identical number of turns. Two transformer sides connected in parallel are replaced by a single coil, with the result that the balun may be produced from a five-wire structure.

20 Claims, 3 Drawing Sheets

BROADBAND BALUN

This application claims the benefit of DE 10 2011 078 549.3, filed on Jul. 1, 2011.

BACKGROUND

The present embodiments relate to a balun, a high-frequency receiver, and a magnetic resonance system.

In high-frequency technology (e.g., in relation to high-frequency receivers of magnetic resonance systems), balancing amplifiers are provided for converting unbalanced-to-ground signals into balanced-to-ground signals. Balancing amplifiers may be implemented on the basis of baluns that include one or more interconnected high-frequency transformers, each of which is embodied as a line transformer. Balancing amplifiers covering the widest possible bandwidth are desirable, such as for balancing amplifiers for magnetic resonance systems. In the case of baluns that include broadband high-frequency transformers, the bandwidth is limited due to parasitic effects such as stray capacitances, for example, due to the finite magnetizing inductance and due to ferrite losses in ferrite cores. If a balancing amplifier is required for operation in the magnetic field (e.g., in high-frequency receivers for magnetic resonance systems), no ferrite may be used because this would go into saturation. For these reasons, the use of baluns in magnetic fields, in high-frequency receivers, and in magnetic resonance systems is a difficult proposition.

SUMMARY AND DESCRIPTION

The present embodiments may obviate one or more of the drawbacks or limitations in the related art. For example, an improved balun that is simpler in design, an improved high-frequency receiver, and an improved magnetic resonance system are provided.

The baluns according to the present embodiments include at least three line transformers, each having two (e.g., precisely two) transformer sides. At least two transformer sides of the balun, which belong to different line transformers, are embodied for the same voltage drop, at least in terms of magnitude, and are embodied with an identical number of turns.

All of the transformer sides may be embodied for the same voltage drop and embodied with an identical number of turns.

The term "different" within the meaning of the present application is not necessarily to be interpreted as "dissimilar." Rather, the phrase "which belong to two different line transformers" may be that the "two . . . line transformers" are not one and the same line transformer.

According to the one embodiment, the line transformers are formed in a known manner by or from a two-wire waveguide (e.g., a pair of winding stacks, coils or coil sections). In this context, a transformer side is to be understood as a primary or secondary transformer side that is formed in each case by one of the coils, coil sections, or winding stacks of the two-wire waveguide. The transformer sides formed from a two-wire waveguide may have turns of twisted copper wire or enameled copper wire. For example, the transformer sides embodied with an identical number of turns have 5, 6 or 7 turns in each case.

The at least two transformer sides belonging to different line transformers and embodied for at least the same voltage drop in terms of magnitude and embodied with an identical number of turns may advantageously be arranged so as to be mutually flux-assisting.

In the balun according to one embodiment, reciprocal flux assistance of the turns of the transformer sides that may be arranged as mutually flux-assisting may be achieved, with the result that on account of the flux assistance, the balun is embodied for a large frequency bandwidth. For example, a ferrite core may be dispensed with for the line transformers. Such a balun may advantageously be used in a magnetic field. The balun according to one embodiment may also be used, for example, in magnetic resonance systems (e.g., in high-frequency receivers of magnetic resonance systems). Owing to the flux assistance, the balun may also be embodied for a large bandwidth without provision of ferrite cores.

In the balun, the at least two transformer sides (e.g., all of the transformer sides) belonging to different line transformers and embodied for the same voltage drop in terms of magnitude and embodied with an identical number of turns may be arranged so as to be mutually flux-assisting.

In the balun according to one embodiment, the at least two transformer sides belonging to different line transformers and embodied for the same voltage drop in terms of magnitude and embodied with an identical number of turns may be arranged so as to be mutually flux-assisting such that the transformer sides are arranged on a common non-ferritic winding carrier.

Alternatively, in the balun according to another embodiment, the at least two transformer sides belonging to different line transformers and embodied for the same voltage drop in terms of magnitude and embodied with an identical number of turns are arranged so as to be mutually flux-assisting such that the transformer sides are arranged as mutually flux-assisting air-core coils.

The transformer sides arranged according to one embodiment on a common non-ferritic winding carrier or as mutually flux-assisting air-core coils may be arranged coaxially with respect to one another and/or extend completely or at least partially along a common axial section. This enables mutual flux assistance to be realized in an efficient manner.

The two transformer sides are beneficially connected such that the same voltage drops in terms of magnitude are produced with the correct sign at the transformer sides.

The phrase "at least three line transformers" within the present application is not to be interpreted exclusively as meaning at least three line transformers that are present separated from one another in each case. For example, two or more transformer sides among the "at least three line transformers" may be connected directly or immediately to one another (e.g., connected in parallel or in series).

In the balun according to one embodiment, reciprocal flux assistance may advantageously be achieved by the transformer sides arranged as mutually flux-assisting, without the requirement for a ferrite core specifically to be present for flux focusing for the line transformers. Such a balun may also be used in a magnetic field. The balun may also be used, for example, in magnetic resonance systems (e.g., in high-frequency receivers of magnetic resonance systems). On account of the flux-assisting arrangement of the transformer sides (e.g., on the common winding carrier or as air-core coils), the balun may also be embodied for a large bandwidth even without provision of ferrite cores.

All of the transformer sides in the balun according to one embodiment are embodied for the same voltage drop, at least in terms of magnitude, are embodied with an identical number of turns, and are all embodied so as to be mutually flux-assisting. The transformer sides arranged on the common winding carrier or so as to be flux-assisting as air-core coils suitably include winding stacks, coils or coil sections that are arranged coaxially with respect to one another and/or that extend completely or at least partially along a common axial section. The two transformer sides are beneficially connected such that the same voltage drops in terms of magnitude are produced with the correct sign at the transformer sides.

The winding carrier may be formed by non-ferritic plastic. In one embodiment, the common winding carrier is a core (e.g., having a diameter of 1 to 10 mm). The core may have a diameter of 3 to 5 mm. In a further embodiment, the common winding carrier is a sleeve.

In the balun according to one embodiment, at least two transformer sides associated with different line transformers and embodied for the same voltage drop (U) and embodied with an identical number of turns may be formed by a common conductor (e.g., a coil, a coil section or a winding stack). In other words, the common conductor replaces the at least two transformer sides associated with different line transformers and embodied for the same voltage drop and embodied with an identical number of turns.

In one embodiment, the two transformer sides formed by a common conductor are connected in parallel with each other. The common conductor may form two coils, coil sections, or winding stacks of the transformer sides of the balun that are formed by a common conductor.

In this way, the at least two transformer sides of the balun according to one embodiment and consequently the balun itself may be implemented in a particularly compact, simple and space-saving configuration.

A balun according to one embodiment is advantageously embodied for impedance conversion (e.g., for 1:4 impedance conversion). In this development, the balun operates not solely as a balancing amplifier, but simultaneously also as a transformer. The balun is advantageously embodied for converting impedance from 50 ohms unbalanced to 200 ohms balanced.

In one embodiment, the balun is a three-cell balun. In the present context, the term "cell" does not necessarily imply a spatially detached, separate compartment, but may also be a "coiled" line in the sense of a two-wire system including two transformer sides.

In this case, the balun advantageously has two line transformers that are connected in parallel on the input side and in series on the output side. In this arrangement, the two line transformers are connected on the input side to the transformer sides of a further line transformer. The transformer sides of the further line transformer form the input of the balun or are conductively connected to the input of the balun. In this embodiment, an input side of a line transformer signifies, in a known manner, a pair of conducting connections formed from one connection each of the primary and the secondary transformer side of the transformer. These are the connections located on the same side of the line transformer.

The balun according to one embodiment includes five separately present transformer sides or is formed by five separately present transformer sides. Separately present transformer sides are understood in this context to be transformer sides that are not formed by a common conductor.

A balun according to one embodiment is particularly beneficially a three-cell balun, in which two transformer sides of the three line transformers in total are formed by a common conductor, the remaining transformer sides in contrast being formed in each case by an individual conductor. Consequently, the balun is formed by five separate transformer sides. In one embodiment, the balun is formed by or out of a five-wire structure.

The balun is suitably embodied for operation at frequencies greater than/equal to 5 MHz and/or less than/equal to 500 MHz. The balun may be embodied for operation in a frequency range covering at least one order of magnitude/decade.

The high-frequency receiver according to one embodiment has at least one balun as described hereintofore and is embodied, for example, as a high-frequency receiver for a magnetic resonance system.

The magnetic resonance system according to one embodiment includes a high-frequency receiver and/or a balun as described hereintofore.

DETAILED DESCRIPTION OF THE DRAWINGS

Figure 1:
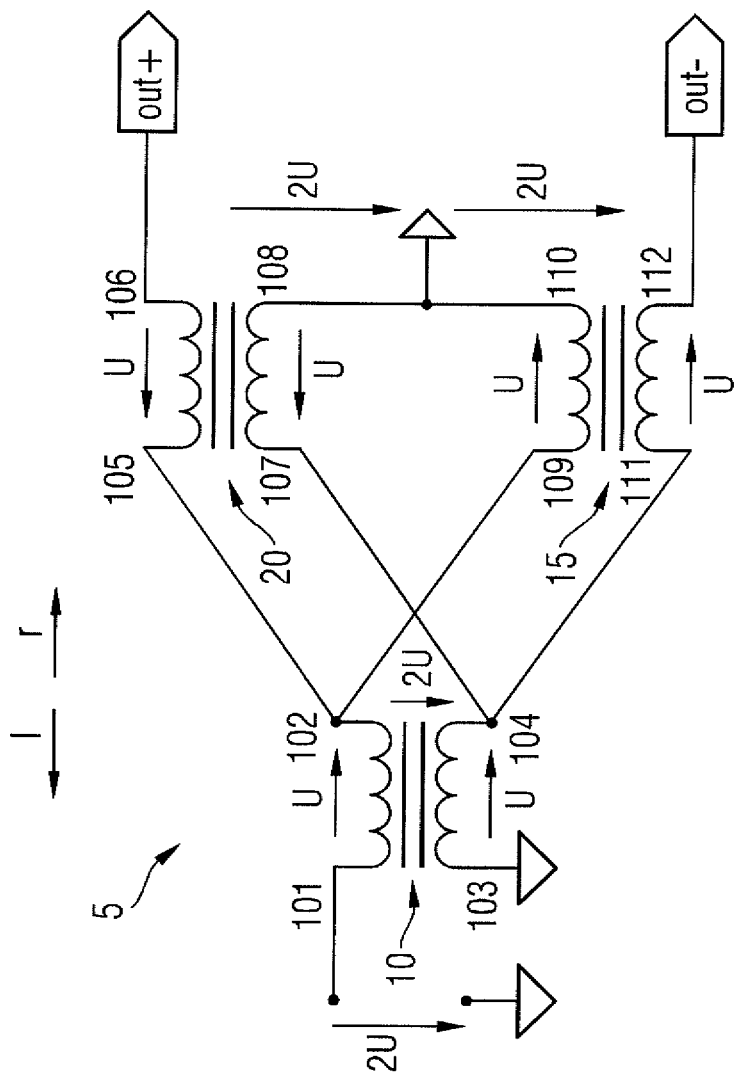
FIG. 1 shows one embodiment of a balun having a plurality of line transformers with transformer sides having identical numbers of turns.

The balun shown in FIG. 1 is embodied as a three-cell balun 5 and includes three line transformers 10, 15, 20. The line transformers 10, 15, 20 each have two transformer sides that in the depicted exemplary embodiment are each embodied as a coil. Each of the coils forms a primary or secondary coil of a line transformer 10, 15, 20.

In the following description, input and output sides of a line transformer 10, 15, 20 are to be understood as a connection pair such as is formed by one connection each of the primary and the secondary transformer side of the line transformer. The connections belonging to an output side or to an input side are each located at the same longitudinal end of the coil. In the schematic layouts according to FIGS. 1, 2 and 3, the input side of a line transformer 10, 15, 20 lies at a side of a line transformer 10, 15, 20 facing in direction 1 and the output side lies at a side facing in direction r.

Of the line transformers 10, 15, 20 of the three-cell balun 5, two line transformers 15, 20 are connected in parallel on the input side (e.g., in relation to input-side pairs of connections 105, 107 and 109, 111 of the line transformers 15, 20). On the output side (e.g., in relation to output-side pairs of connections 106, 108 and 110, 112 of the line transformers 15, 20), the two line transformers 15, 20 are connected to each other in series.

A third line transformer 10 is connected to the two line transformers 15, 20 on the input side. The third line transformer 10 has two sides located between connections 101 and 102 and between connections 103 and 104, respectively. The input sides of the line transformers 15, 20 are each connected by way of the connections 102 and 104 to the two sides of the third line transformer 10. All of the transformer sides of the three line transformers 10, 15, 20 are embodied for voltage drops U of the same magnitude and have the same number of turns. Identical voltage drops U therefore result at the transformer sides of the line transformers 10, 15, 20 in each case between the connections 101 and 102, 103 and 104, 106 and 105, 108 and 107, 109 and 110, 111 and 112.

Figure 2:
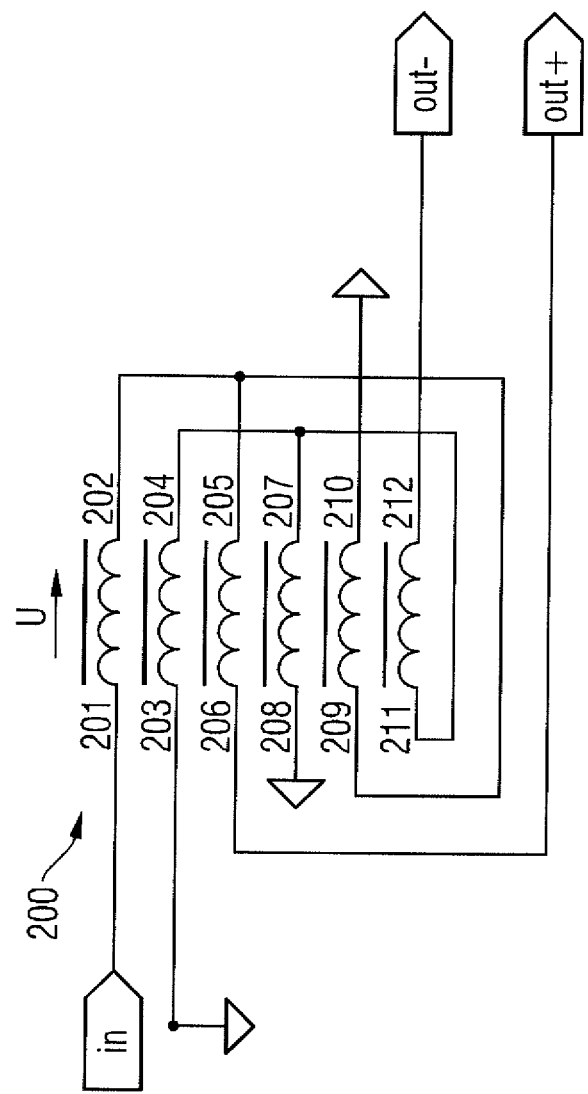
FIG. 2 shows a variation of one embodiment of the balun shown in FIG. 1 having a common non-ferritic core for all transformer sides.

An identical voltage U drops at each transformer side of the line transformers 10, 15, 20. Consequently, the transformer sides of each line transformer 10, 15, 20 of the balun 5 may be arranged on a single, common, non-ferritic winding carrier, as is shown in FIG. 2 with reference to a further balun 200 according to one embodiment (e.g., the horizontal bars shown in FIG. 2 between the connections 201 and 202, 203 and 204, 206 and 205, 208 and 207, as well as 209 and 210; symbols for ferrite cores do not symbolize ferritic cores in this context but, contrary to normal convention, non-ferritic cores). The structure of the balun 5 shown in FIG. 1 is accordingly reduced to the schematic representation of the balun 200 shown in FIG. 2. In the exemplary embodiment shown in FIG. 2, the non-ferritic winding carrier is a plastic core with a diameter of 3.7 mm (e.g., the winding carrier may be dimensioned differently in further exemplary embodiments that are not shown explicitly or may be embodied from any other non-ferritic material). The transformer sides of each individual transformer 10, 15, 20 of the balun 5 therefore have a good coupling factor among one another. The transformer sides of each individual transformer 10, 15, 20 of the balun 5 are interconnected such that the same voltage drops (U) in terms of magnitude are produced with the correct sign at the transformer sides.

The connections 201, 202, 203, 204, 205, 206, 207, 208, 209, 210, 211, 212 shown in FIG. 2 correspond to the connections 101, 102, 103, 104, 105, 106, 107, 108, 109, 110, 111, 112 (connections corresponding to one another in FIGS. 1 and 2 differ in the reference sign only by the leading digit).

In a further exemplary embodiment that is not shown specifically, the balun corresponds to the balun 200 shown in FIG. 2, although the transformer sides of the line transformers 10, 15, 20 are not arranged on a common winding carrier. Rather, the transformer sides are embodied as air-core coils. The turns are rigidly fixed to one another using an adhesive. In this exemplary embodiment, the air-core coils are arranged so as to be mutually flux-assisting (e.g., the helical coils formed by the turns are arranged coaxially with respect to the longitudinal axis of the coils and along a common axial section, and are interconnected such that the same voltage drops in terms of magnitude are produced with the correct sign at the transformer sides).

Figure 3:
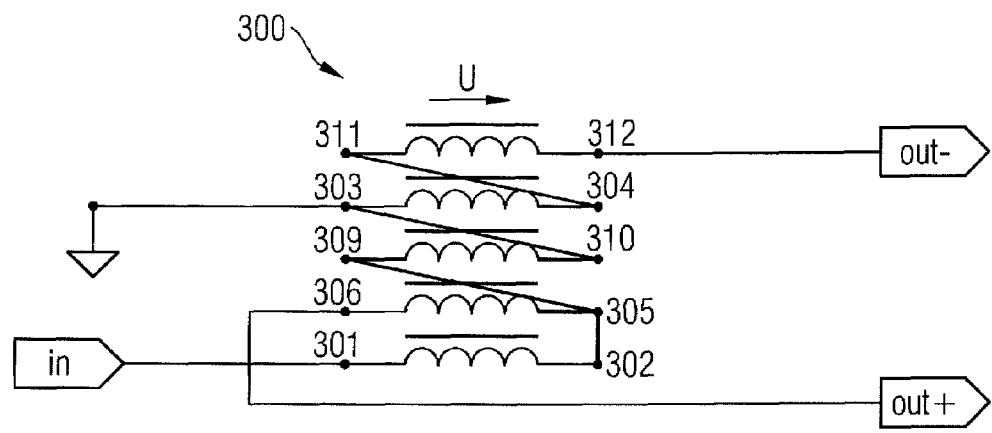
FIG. 3 shows a further variation of one embodiment of the balun according to FIG. 1, in which two transformer sides are formed by a common coil.

The two transformer sides of the balun 200 shown in FIG. 2, which are located between the connections 203 and 204 as well as between the connections 207 and 208, are connected in parallel with each other. In a further balun 300 according to one embodiment, as illustrated in FIG. 3, the transformer sides are replaced by a single common conductor (e.g., a single coil between the connections 303 and 304). Otherwise, the balun 300 corresponds to the balun 200 shown in FIG. 2. The connections 301, 302, 303, 304, 305, 306, 307, 308, 309, 310, 311, 312 shown in FIG. 3 correspond to the connections 201, 202, 203, 204, 205, 206, 207, 208, 209, 210, 211, 212 shown in FIG. 2 (the reference signs corresponding to one another differ only by the leading digit). The balun 300 accordingly has only five separately present transformer sides (e.g., coils). The balun 300 therefore forms an easy-to-manufacture, simply constructed and compact five-wire structure.

Figure 4:
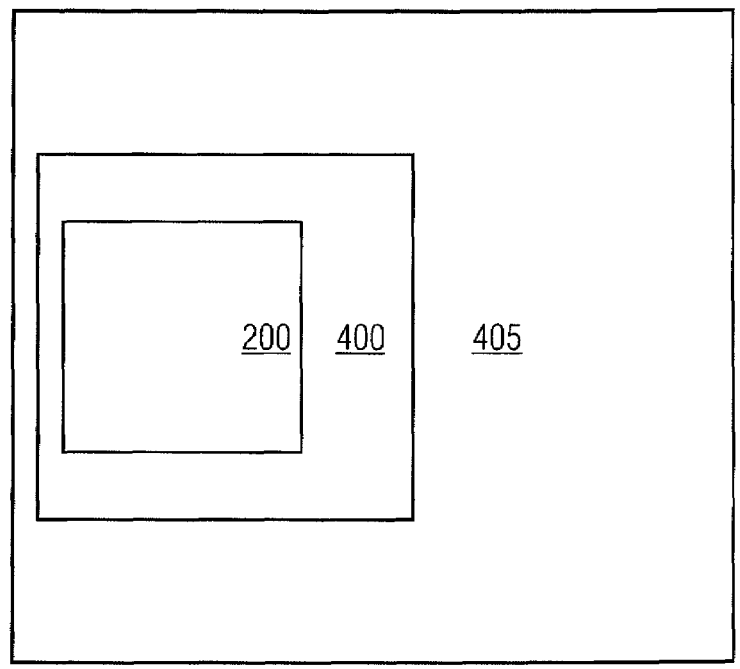
FIG. 4 shows one embodiment of a magnetic resonance system having a high-frequency receiver with a balun according to FIG. 2.

One embodiment of a magnetic resonance system 405 schematically represented in FIG. 4 has a high-frequency receiver 400. The high-frequency receiver 400 has one embodiment of the balun 200, as shown in FIG. 2. Instead of the balun 200, a magnetic resonance system (not shown specifically) has one embodiment of the balun 300, as shown in FIG. 3. In all other respects, the magnetic resonance system is embodied identically.

In the exemplary embodiments shown, the baluns are embodied for the frequency range from 12.5 MHz inclusive to 123 MHz inclusive. In the illustrated baluns, the coils include seven turns of twisted copper wire or enameled copper wire. The copper wire or enameled copper wire has a diameter of 160 μm and is wound over a length of 4 mm (in further exemplary embodiments, not shown separately, the coils have different dimensions, and the baluns are embodied for a frequency range from 5 MHz inclusive to 70 MHz inclusive or from 35 MHz inclusive to 500 MHz inclusive). In other exemplary embodiments that are not shown explicitly, the coils are formed from a different material.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A balun comprising:
   at least three line transformers each having two transformer sides,
   wherein all of the transformer sides of the at least three line transformers are configured for the same voltage drop and are configured with the same number of turns.

2. The balun as claimed in claim 1, wherein the balun is in a magnetic resonance system.

3. The balun as claimed in claim 1, wherein the transformer sides are configured for the same voltage drop in terms of magnitude, and
   wherein the transformer sides are arranged so as to be mutually flux-assisting such that the transformer sides are interconnected with the same voltage drop in terms of magnitude and with a same sign at each of the transformer sides.

4. The balun as claimed in claim 3, wherein the transformer sides are arranged so as to be mutually flux-assisting such that the transformer sides are arranged on a common non-ferritic winding carrier.

5. The balun as claimed in claim 3, wherein the transformer sides are arranged so as to be mutually flux-assisting such that the transformer sides are arranged as mutually flux-assisting air-core coils.

6. The balun as claimed in claim 1, wherein the transformer sides are formed by a common conductor.

7. The balun as claimed in claim 1, wherein the balun is configured for impedance conversion.

8. The balun as claimed in claim 7, wherein the balun is configured for 1:4 impedance conversion.

9. The balun as claimed in claim 1, wherein the balun is a three-cell balun.

10. The balun as claimed in claim 1, further comprising two line transformers that are connected in parallel with each other on an input side and in series on an output side, and wherein the two line transformers are connected on the input side to transformer sides of a further line transformer, the transformer sides of the further line transformer forming an input of the balun or being conductively connected to the input of the balun.

11. The balun as claimed in claim 1, wherein the balun further comprises five separately present transformer sides or is formed by the five separately present transformer sides.

12. The balun as claimed in claim 1, wherein the balun is configured for frequencies greater than or equal to 5 MHz, less than or equal to 500 MHz, or greater than or equal to 5 MHz and less than or equal to 500 MHz.

13. The balun as claimed in claim 3, wherein the transformer sides are formed by a common conductor.

14. The balun as claimed in claim 3, wherein the balun is configured for impedance conversion.

15. The balun as claimed in claim 3, wherein the balun is a three-cell balun.

16. The balun as claimed in claim 3, further comprising two line transformers that are connected in parallel with each other on an input side and in series on an output side, and
   wherein the two line transformers are connected on the input side to transformer sides of a further line transformer, the transformer sides of the further line transformer forming an input of the balun or being conductively connected to the input of the balun.

17. The balun as claimed in claim 3, wherein the balun further comprises five separately present transformer sides or is formed by the five separately present transformer sides.

18. A high-frequency receiver comprising:
   at least one balun comprising:
      at least three line transformers each having two transformer sides,
      wherein all of the transformer sides of the at least three line transformers are configured for the same voltage drop and are configured with the same number of turns.

19. The high-frequency receiver as claimed in claim 18, wherein the high-frequency receiver is for a magnetic resonance system.

20. A magnetic resonance system comprising:
   a balun or a high-frequency receiver comprising the balun, the balun comprising:
      at least three line transformers each having two transformer sides,
      wherein all of the transformer sides of the at least three line transformers are configured for the same voltage drop and are configured with the same number of turns.

* * * * *